(12) United States Patent
Sulzer et al.

(10) Patent No.: US 10,935,002 B2
(45) Date of Patent: Mar. 2, 2021

(54) METHOD AND SYSTEM FOR TESTING A LIGHTING PROTECTION SYSTEM OF A WIND TURBINE

(71) Applicant: Sulzer & Schmid Laboratories AG, Oetwil am See (CH)

(72) Inventors: Thomas Sulzer, Kilchberg (CH); Joonas Asikainen, Zürich (CH)

(73) Assignee: Sulzer & Schmid Laboratories AG, Oetwil am See (CH)

( * ) Notice: Subject to any disclaimer, the term of this patent is extended or adjusted under 35 U.S.C. 154(b) by 0 days.

(21) Appl. No.: 16/216,016

(22) Filed: Dec. 11, 2018

(65) Prior Publication Data
US 2019/0178230 A1   Jun. 13, 2019

(30) Foreign Application Priority Data

Dec. 11, 2017   (EP) .................................... 17206430

(51) Int. Cl.
*F03D 17/00*   (2016.01)
*G01R 31/02*   (2006.01)
(Continued)

(52) U.S. Cl.
CPC ............ *F03D 17/00* (2016.05); *B64C 39/024* (2013.01); *F03D 80/30* (2016.05); *G01R 31/50* (2020.01);
(Continued)

(58) Field of Classification Search
CPC ..... G01R 29/0842; G01R 31/50; F03D 17/00; F03D 80/30; B64C 39/024; B64C 2201/12; F05B 2260/80; F05B 2260/83
(Continued)

(56) References Cited

U.S. PATENT DOCUMENTS 5,777,479 A * 7/1998 Kuhlman ............. G01R 31/001
                                                  324/452
5,834,940 A * 11/1998 Brooks .................. G01R 31/52
                                                  324/424
(Continued)

FOREIGN PATENT DOCUMENTS

| EP | 1011182 A1 | 6/2000 |
|----|------------|--------|
| EP | 3211226 A1 | 8/2017 |
| JP | 2017166382 A | 9/2017 |

OTHER PUBLICATIONS

European Search Report in application EP17206430, completed Jun. 14, 2018.

*Primary Examiner* — Tung X Nguyen
*Assistant Examiner* — Robert P Alejnikov, Jr.
(74) *Attorney, Agent, or Firm* — Oppedahl Patent Law Firm LLC

(57) ABSTRACT

A lightning protection system of a wind turbine (10) comprises electrically grounded receptors (51, 52) on turbine blades. A corresponding electrical ground connection must be tested regularly. For such a test, an unmanned aerial vehicle or UAV (4) places an electrode (41) near a receptor (51, 52). Using a high voltage generator (42), a high voltage is created between the electrode (41) and the receptor (51, 52), causing an electrical arc (45) between the two. A corresponding current through the lightning protection system (5) indicates whether the ground connection is in order. Thanks to the high voltage used, the electrical arc (45) can bridge a gap between the electrode (41) and receptor (51, 52) of at least several millimetres. It is not necessary to establish a direct physical contact between the electrode (41) and the receptor (51, 52). This simplifies controlling the UAV and speeds up the testing procedure.

15 Claims, 2 Drawing Sheets

Figure 1:
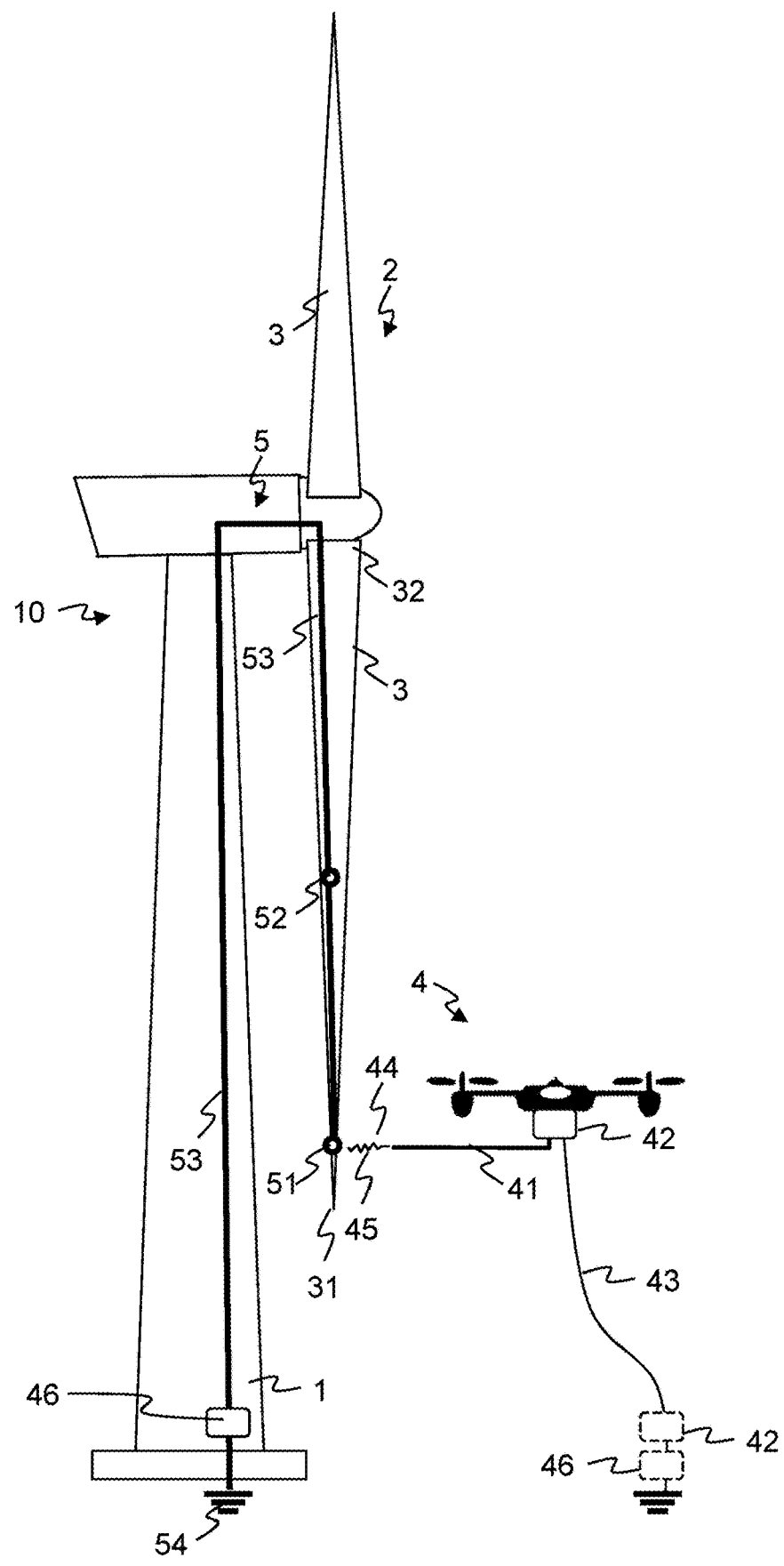

(51) Int. Cl.
 *B64C 39/02* (2006.01)
 *F03D 80/30* (2016.01)
 *G01R 31/50* (2020.01)

(52) U.S. Cl.
 CPC ....... *B64C 2201/12* (2013.01); *F05B 2260/80* (2013.01); *F05B 2260/83* (2013.01)

(58) Field of Classification Search
 USPC .......................................................... 324/72
 See application file for complete search history.

(56) References Cited

U.S. PATENT DOCUMENTS

| | | | |
|---|---|---|---|
| 5,962,806 A * | 10/1999 | Coakley | F42B 12/36 102/293 |
| 6,140,810 A * | 10/2000 | Bohnert | G01R 15/241 324/72 |
| 6,392,396 B1 * | 5/2002 | Hubler | G01R 31/001 324/72 |
| 7,988,415 B2 | 8/2011 | Hardison | |
| 2010/0006312 A1 * | 1/2010 | Rizk | F03D 1/065 174/2 |
| 2011/0014356 A1 * | 1/2011 | Fornes | C09D 7/70 427/58 |
| 2011/0140724 A1 | 6/2011 | Olson | |
| 2012/0262708 A1 * | 10/2012 | Connolly | G05D 1/0094 356/237.2 |
| 2012/0300059 A1 * | 11/2012 | Stege | F03D 17/00 348/114 |
| 2013/0336786 A1 | 12/2013 | Kissinger | |
| 2014/0257723 A1 * | 9/2014 | Lee | G01R 31/50 702/58 |
| 2016/0047850 A1 * | 2/2016 | Bruins | F03D 80/00 324/715 |
| 2017/0248647 A1 * | 8/2017 | Matsushita | B64C 39/024 |

* cited by examiner

METHOD AND SYSTEM FOR TESTING A LIGHTING PROTECTION SYSTEM OF A WIND TURBINE

The invention relates to the field of plant inspection, and in particular to a method and system for testing a lightning protection system of a wind turbine.

The wind-energy sector is in need of new inspection methods that can capture and document the condition of wind turbines. In particular, there is a need for testing lightning protection systems of turbines. A lightning protection system typically comprises receptors on the blades, intended to be hit by lighting and to lead the lightning current via electrical down conductors to ground potential. In order to ensure proper functioning of the lightning protection system, the electrical connection from receptor to ground potential needs to be verified. Corresponding inspections can be carried out manually by rope access teams.

Alternatively, mechanical devices for contacting the receptors have been proposed, as in US 2011/140724. Such devices take long to set up and are costly to operate.

Alternatively, testing devices built into the turbine blades have been proposed, as in US 2013/336786 or U.S. Pat. No. 7,988,415. Such fixed systems increase the cost of the turbine and are not applicable to existing turbines.

It is therefore an object of the invention to create a method and system for testing a lightning protection system of a wind turbine of the type mentioned initially, which overcomes the disadvantages mentioned above.

These objects are achieved by a method and system for testing a lightning protection system of a wind turbine according to the claims.

The method for testing a lightning protection system of a wind turbine comprises the steps of
- positioning, with an unmanned aerial vehicle (UAV), an electrode near a receptor of a lightning protection system (LPS) of a turbine;
- creating, with a high voltage generator, a high voltage between the electrode and the receptor;
- thereby creating an electrical arc between the electrode and the receptor;
- detecting, with a current detection device, a current caused by the arc flowing through the lightning protection system.

The presence of the current gives a qualitative indication that the lightning protection system provides a conducting path from the receptor to ground, that is, an earth grounding connection of the lightning protection system.

It thus is not necessary to establish a galvanic connection between the electrode and a receptor. This eliminates positioning issues.

Furthermore, the arc can bridge oxide layers on the surface of the receptors, which would cause problems when attempting to establish a galvanic connection.

In embodiments, the arc spans an air gap between the electrode and the receptor of at least five millimetres, or at least one centimeter.

In embodiments, the method comprises establishing a reference potential for the high voltage with a reference conductor between the UAV and the ground.

Typically, the reference conductor is a conducting cable between the UAV and the ground. Here, the ground is the physical ground. The physical ground is at ground potential, but the point at the (physical) ground, to which point the reference conductor is electrically connected, can be at ground potential or at the high voltage: In embodiments, the reference conductor is at ground potential, and serves as reference potential for the high voltage generator located on the UAV. In other embodiments, the reference conductor is at the potential of the high voltage, and is connected at one end to the electrode and at the other to a high voltage output electrode of a high voltage generator located on the physical ground. When referring to the ground, it is understood that in maritime applications, the sea level takes the place of the (physical) ground, being at ground potential. Thus, the (physical) ground can be a land surface or sea surface.

In embodiments, the method comprises rotating a blade whose lightning protection system is to be tested in a vertical position, and positioning an electrode that extends substantially in a horizontal direction from the UAV to be near the receptor that is to be tested.

In embodiments, the method comprises rotating a blade whose lightning protection system is to be tested in a horizontal position, and positioning an electrode that extends substantially in a vertical direction from the UAV to be near the receptor, with the UAV positioned below the receptor that is to be tested. In this situation, the pitch of the blade can be adjusted so that the receptor is at the lower side of the blade.

The system for testing a lightning protection system of a wind turbine, comprising
- an unmanned aerial vehicle (UAV) comprising an electrode extending from the UAV;
- a high voltage generator arranged to generate a high voltage at the electrode;
- for creating an electrical arc between the electrode and a receptor of a lightning protection system of a wind turbine;
- a current detection device for detecting a current caused by the arc.

In embodiments, the high voltage generator is configured to generate a voltage of at least 10 kV or at least 100 kV.

In embodiments, the high voltage generator is arranged on and moved with the UAV.

In embodiments, the system comprises a reference conductor for establishing a reference potential for the high voltage generator, the reference conductor being a conductor between a reference electrode of the high voltage generator and an electric ground potential.

In embodiments, the high voltage generator is arranged on the physical ground. More specifically, it can be located on a land surface or sea surface, for example on a mobile platform such as a vehicle on a land surface or on a sea surface.

In embodiments, the system comprises a reference conductor connecting a high voltage electrode of the high voltage generator with the electrode.

In embodiments, the current detection device is arranged to detect a current flowing in the lightning protection system of the turbine.

In embodiments, the current detection device is arranged to detect a current flowing in the electrode.

In embodiments, the current detection device is arranged to detect a current flowing in the reference conductor.

In embodiments, the system comprises elements for synchronising measurements made with the current detection device with the time at which the arc occurs. Such elements can comprise a detector for detecting the time when the arc occurs. The current detection device can be configured to time-stamp current measurements of a sequence of current measurements. Alternatively, or in addition, the system can be configured to start to measure the current shortly before the high voltage is generated. For this, the system can be configured to transmit a synchronisation signal from the high voltage generator to the current detection device. The synchronisation signal can be transmitted wirelessly.

Further embodiments are evident from the dependent patent claims. Features of the method claims may be combined with features of the device claims and vice versa.

Figure 2:
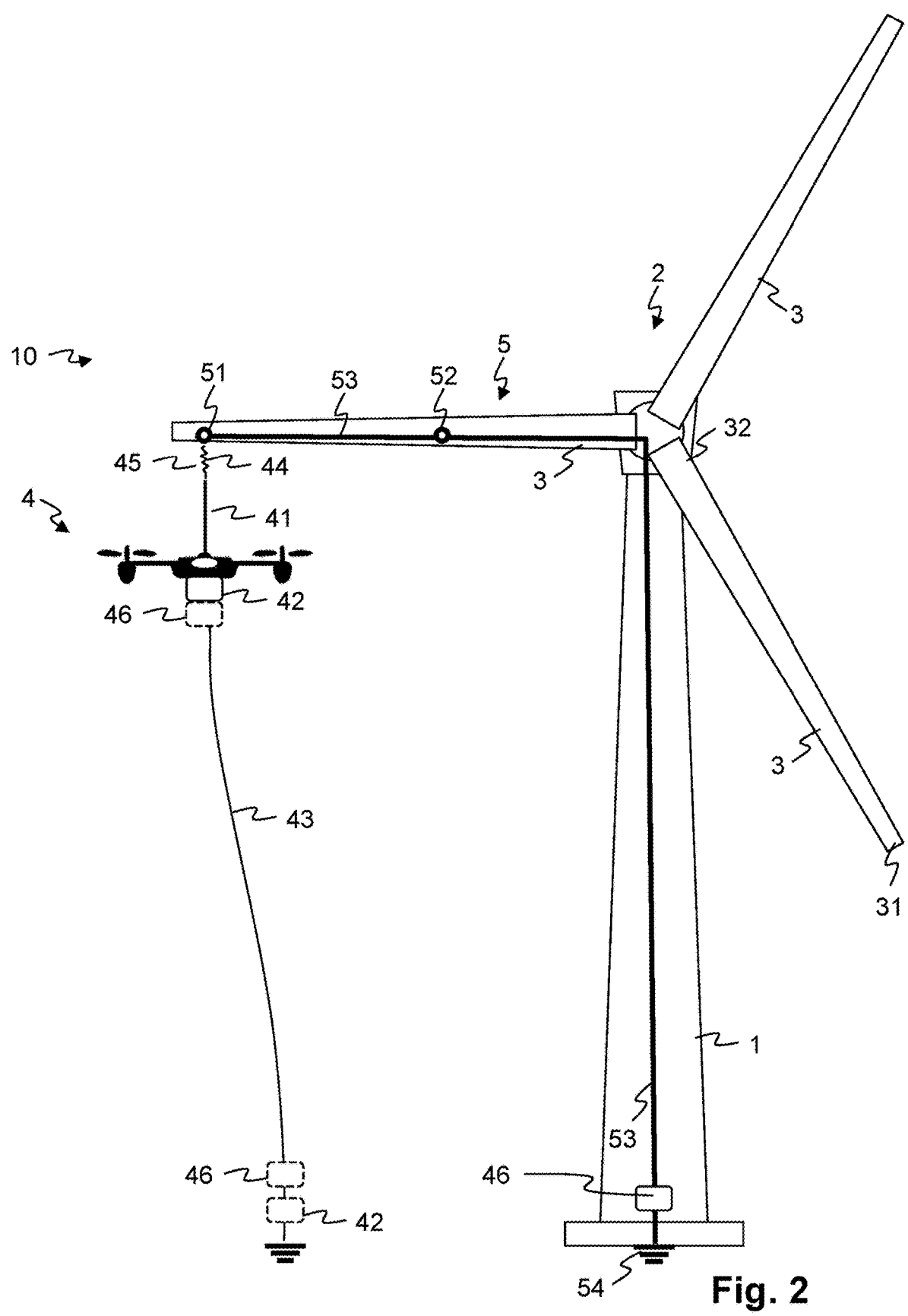

The subject matter of the invention will be explained in more detail in the following text with reference to exemplary embodiments which are illustrated in the attached drawings, in which:

FIG. 1 a wind turbine and a UAV with a testing system, with a horizontally projecting electrode on the UAV; and FIG. 2 a wind turbine and a UAV with a testing system, with a vertically projecting electrode on the UAV.

FIGS. 1 and 2 schematically show a wind turbine 10 comprising a tower 1 supporting a nacelle enclosing a drive train driving an electrical generator via a gearbox. Turbine blades 3 are arranged on a hub to form a rotor 2 driving the drive train. Each blade 3 is typically secured at its root end 32, and then spans radially outboard to a free end or tip 31.

A lightning protection system 5 (only shown for one blade 3) comprises in each blade 3 a tip receptor 51 near the tip 31 and optionally one or more intermediate receptors 52. Further receptors can be arranged on the nacelle. The receptors 51, 52 are connected, through a down conductor 53 to a earth grounding grid 54.

Further shown is an unmanned aerial vehicle (UAV) 4, such as a multicopter, as it can be used in embodiments of the invention. It carries an electrode 41 for creating an electric arc between the electrode 41 and a receptor.

In embodiments, not shown in the figures, the electrode 41 can be suspended by means of a gimbal with one or more degrees of rotational freedom, for positioning the electrode 41 independently of the exact orientation of the UAV 4. This can allow to compensate for movement of the UAV 4, stabilising the position of the tip of the electrode 41.

The UAV can comprise a GPS module and/or an inertial sensor, compass, gyroscope etc. A flight controller can be arranged to integrate data from the GPS and the other sensors, and a computer model of the turbine 10, including the location of the receptors 5, and to generate flight commands such as position or speed vectors to be executed by the UAV 4 for positioning the electrode 41 near the receptors 51, 52.

A testing system comprises a high voltage generator 42 and a current detection device 46. The high voltage generator 42 is arranged to generate a high voltage between the electrode 41 and one of the receptors 51, 52. The voltage being sufficiently large, it will cause an electrical discharge, resulting in an arc 45 bridging an air gap 44 between the electrode 41 and the receptor. The current detection device 46 is arranged to detect the presence of a current flowing due to this arc 45. In embodiments, the current detecting device 46 measures a value of the current. In other embodiments, it merely detects the presence of the current.

A reference conductor 43 can be arranged to provide a reference potential for the voltage generated by the high voltage generator 42.

The high voltage generator 42 can be arranged on the UAV 4, or alternatively (shown in dotted lines) on the ground, at a lower end of the reference conductor 43. In this case the reference conductor 43 conducts the high voltage generated by the high voltage generator 42 to the UAV 4 and the electrode 41.

The dielectric strength of air is ca. 3 kV/mm. Thus, a high voltage of 100 kV can bridge an air gap air gap of roughly 3 cm and cause an arc 45.

For generating such voltages, the high voltage generator 42 can comprise, for example, a Tesla coil, or a Marx generator, or a step up high voltage pulse inverter. The high voltage generator 42 can be powered by batteries, especially if it is arranged on the UAV 4.

If the high voltage generator 42 is arranged on the ground, such as a land surface or on the surface of a body of water, it can be located in a mobile platform or vehicle, for example, a wheeled vehicle or a boat.

Generating an arc 45 eliminates the need for exact positioning and contacting the receptors 51, 52 with the electrode 41. Furthermore, the arc 45 will bridge layers of oxide that typically will form on the surface of the receptors 51, 52.

The high voltage generator 42 can be configured to continuously increase the voltage generated, until a maximum is reached or until a discharge through the arc 45 occurs.

The high voltage generator 42 can be configured to generate a high voltage pulse, can cause the arc 45 to occur.

The current detection device 46 can be arranged in a ground connection of the lightning protection system 5, e.g. where the down conductor 53 is connected to a earth grounding grid 54 or another means for grounding the lightning protection system 5.

According to other embodiments (shown in dotted lines), the current detection device 46 is arranged on the UAV 4 or at the lower end of the reference conductor 43.

In the embodiment of FIG. 1, the electrode 41 projects essentially in a horizontal direction from the UAV 4. For testing one of the receptors 51, 52, the UAV 4 is controlled to approach the receptors 51, 52 sideways. The pitch of the blade 3 is preferably adjusted so that the UAV 4 can be located at a safe distance from the tower 1.

In the embodiment of FIG. 2, the electrode 41 projects essentially in a vertical direction, upwards from the UAV 4. For testing one of the receptors 51, 52, the UAV 4 is controlled to approach the receptors 51, 52 from below. The pitch of the blade 3 is preferably adjusted so that receptors 51, 52 to be tested are on the underside of the lightning protection system 5.

The invention claimed is:

1. A method for testing a lightning protection system of a wind turbine, comprising the steps of
positioning, with an unmanned aerial vehicle (UAV) (4), an electrode (41) near a receptor (51, 52) of a lightning protection system (5) of a turbine (10);
creating, with a high voltage generator (42), a high voltage between the electrode (41) and the receptor (51, 52);
thereby creating an electrical arc (45) between the electrode (41) and the receptor (51, 52);
detecting, with a current detection device (46), a current caused by the arc (45) flowing through the lightning protection system (5);
wherein the arc (45) spans an air gap (44) between the electrode (41) and the 15 receptor (51, 52) of at least five millimetres.

2. The method of claim 1, wherein the arc (45) spans an air gap (44) between the electrode (41) and the receptor (51, 52) of, or at least one centimeter.

3. The method of claim 1, comprising establishing a reference potential for the high voltage with a reference conductor (43) between the UAV (4) and the ground.

4. The method of claim 1, comprising rotating a blade (3) whose lightning protection system (5) is to be tested in a vertical position, and positioning an electrode (41) that extends substantially in a horizontal direction from the UAV (4) to be near the receptor (51, 52).

5. The method of claim 1, comprising rotating a blade (3) whose lightning protection system (5) is to be tested in a horizontal position, and positioning an electrode (41) that extends substantially in a vertical direction from the UAV (4) to be near the receptor (51, 52), with the UAV (4) positioned below the receptor (51, 52).

6. A system for testing a lightning protection system (5) of a wind turbine, comprising
    an unmanned aerial vehicle (UAV) (4) comprising an electrode (41) extending from the UAV (4);
    a high voltage generator (42) arranged to generate a high voltage at the electrode (41);
    for creating an electrical arc (45) between the electrode (41) and a receptor (51, 52) of a lightning protection system (5) of a wind turbine (10);
    a current detection device (46) for detecting a current caused by the arc (45);
    the UAV disposed to position itself relative to the receptor so that the arc spans an air gap of at least five millimeters.

7. The system of claim 6, wherein the high voltage generator (42) is configured to generate a voltage of at least 100 kV.

8. The system of claim 6, wherein the high voltage generator (42) is arranged on and moved with the UAV (4).

9. The system of claim 8, comprising a reference conductor (43) for establishing a reference potential for the high voltage high voltage generator (42), the reference conductor (43) being a conductor between a reference electrode of the high voltage generator (42) and an electric ground potential.

10. The system of claim 6, wherein the high voltage generator (42) is arranged at ground level or sea level.

11. The system of claim 10 wherein the high voltage generator (42) is arranged on a mobile platform.

12. The system of claim 10, comprising a reference conductor (43) connecting a high voltage electrode of the high voltage generator (42) with the electrode (41).

13. The system of claim 6, wherein the current detection device (46) is arranged to detect a current flowing in the lightning protection system (5) of the turbine (10).

14. The system of claim 6, wherein the current detection device (46) is arranged in a ground connection of the lightning protection system (5).

15. The system of claim 6, comprising elements for synchronising measurements made with the current detection device (46) with the time at which the arc (45) occurs.

\* \* \* \* \*